(12) United States Patent
Jourdan et al.

(10) Patent No.: US 7,002,873 B2
(45) Date of Patent: Feb. 21, 2006

(54) MEMORY ARRAY WITH STAGED OUTPUT (75) Inventors: Stephan J. Jourdan, Portland, OR (US); Boyd S. Phelps, Hillsboro, OR (US); Chris E. Yuker, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 44 days.

(21) Appl. No.: 10/739,268

(22) Filed: Dec. 19, 2003

(65) Prior Publication Data
US 2005/0135178 A1 Jun. 23, 2005

(51) Int. Cl.
*G11C 8/00* (2006.01)

(52) U.S. Cl. .................. 365/230.03; 365/233; 365/221

(58) Field of Classification Search ........... 365/230.03, 365/233, 221
See application file for complete search history.

(56) References Cited

U.S. PATENT DOCUMENTS 5,978,303 A * 11/1999 Takasugi et al. ....... 365/230.03
6,097,657 A *  8/2000 Ng et al. .................... 365/221

* cited by examiner

*Primary Examiner*—Huan Hoang
(74) *Attorney, Agent, or Firm*—Kenyon & Kenyon (57) ABSTRACT Embodiments of the present invention provide a method and system for staging the data output from an addressable memory location as a plurality of fields. In embodiments, each field of a data item that is stored at an address may be output during a different clock cycle. In further embodiments, the most time critical field may be output first.

23 Claims, 6 Drawing Sheets

MEMORY ARRAY WITH STAGED OUTPUT

TECHNICAL FIELD

The present invention relates to memory arrays and to methods of reading stored data out of a memory array.

BACKGROUND OF THE INVENTION

Computerized systems typically store data in memory arrays. A memory array may be arranged as, for example, a group of data cells, with each cell storing one or more bits of data. In this arrangement, a cell or a group of cells may be identified by a memory address. Examples of memory arrays are a dynamic random access memory (DRAM) array, static random access memory (SRAM) array, a read only memory (ROM) array, etc. A memory array may be characterized by a single set of control circuitry that controls the input to and output from that array.

A data item is typically written to a memory array along with an address, and the memory array then stores the data item in memory cells that are identified by that address. At a later time, the memory array may receive a command to read and output the data at that address. Typically, the memory array will then output all of the data stored as a single data item at the same time.

For example, a memory array may receive a command to write data "ABCDEF" to an address 0010. The memory array will then store this data at location 0010. At a later time, the memory array may receive a command to read the data at location 0010. Upon receiving this read command, the memory array will cause the memory cells corresponding to the address 0010 to provide the data stored at that address (here, ABCDEF) to an output path. After allowing for all of the data stored at that address to reach an output port, the memory array will output the data through the output port. Thus, although the data in a particular memory location in the array may not all be equally time sensitive, the data from that location will be output from the memory array at the same time.

DETAILED DESCRIPTION

Following is a description of several examples of an improved memory array that outputs the data stored at a particular address in a plurality of stages. It will be appreciated that modifications and variations of these examples are covered by the teachings provided below and are within the purview of the appended claims.

Figure 1:
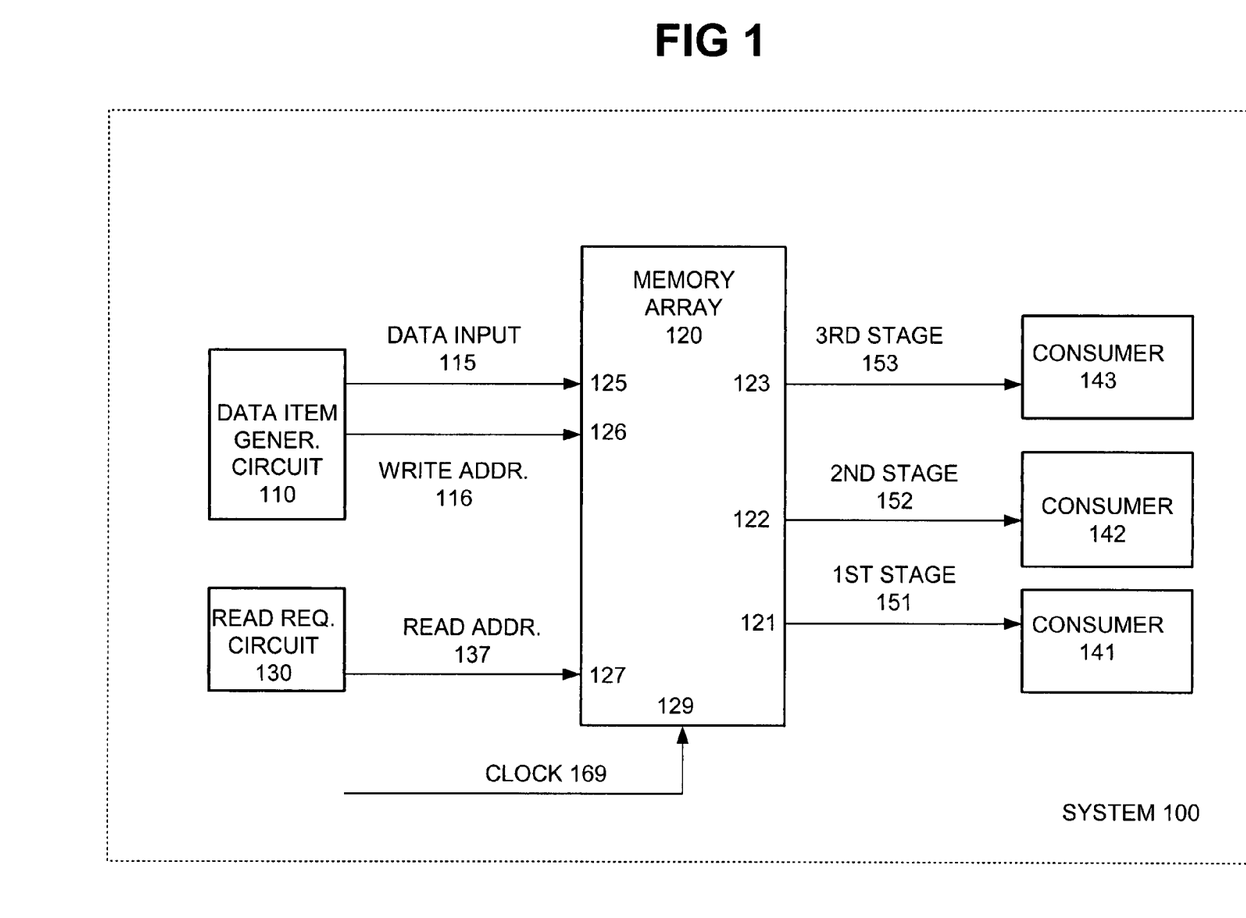
FIG. 1 is a block diagram of a system in which the data output from a memory array is staged in accordance with an embodiment of the present invention.

FIG. 1 is a block diagram of a system 100 in which the output from a memory array is staged in accordance with an embodiment of the present invention. As shown in FIG. 1, system 100 includes a memory array 120 that is coupled to a data item generation circuit 110, a read request circuit 130, and a plurality of data consumers 141–143. Data item generation circuit 110 may be a circuit that generates a data item that is to be stored in memory array 120, and read request circuit 130 may be a circuit that generates a request to read the data item from memory array 120. In other embodiments, data item generation circuit 110 and read request circuit 130 may be part of the same circuit. Memory array 120 may be, for example, a trace cache array in a microprocessor, a branch target predictor cache, a data staging queue, etc. Data consumers 141–143 may be circuits that use the data read from memory array 120. Data consumers 141–143 may be, for example, instruction decode logic or execution stacks, etc. In other embodiments, system 100 may have more or less data consumers than shown in FIG. 1. In other embodiments, data consumers 141–143 may part of the same circuit.

Data item generation circuit 110 may be coupled to memory array 120 at input ports 125 and 126 by a data input line 115 and a write address line 116. Read request circuit 130 may be coupled to memory array 120 at input port 127 by a read address line 137. Memory array 120 may also be coupled at an input port 129 to a clock 169 which may be a system clock. Data consumer 141 may be coupled to memory array 120 at an output port 121 by a first stage data output line 151. Similarly, data consumer 142 may be coupled to memory array 120 at an output port 122 by a second stage data output line 152, and data consumer 143 may be coupled to memory array 120 at an output port 123 by a third stage data output line 153. Of course, system 100 may contain other elements than shown in FIG. 1, such as for example a read enable line and a write enable line connected to memory array 120. As shown in FIG. 1, memory array 120 may have a plurality of sides, and input ports 126 and 127 may be on a different side of memory array 120 than data output ports 121–123.

In an embodiment, data item generation circuit 110 may write a data item to be stored at a particular address in memory array 120, and at a later time read request circuit 130 may request that the data item stored at that address be read from memory array 120. Different parts of the data item may then be output to data consumers 141–143 at different stages, such as for example at different clock cycles.

Figure 2:
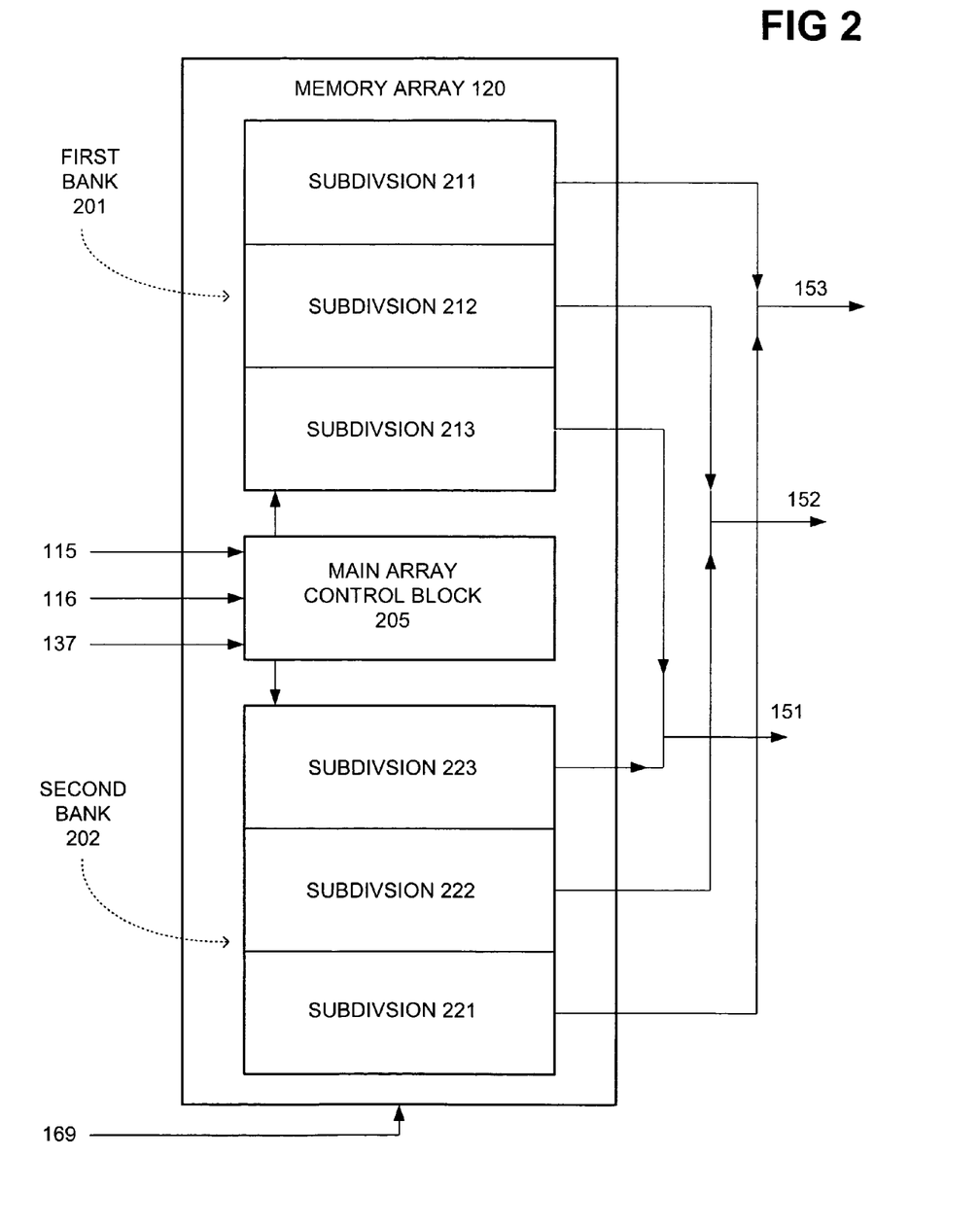
FIG. 2 is a block diagram of a memory array in accordance with an embodiment of the present invention.

FIG. 2 is a block diagram of a memory array in accordance with an embodiment of the present invention. FIG. 2 shows memory array 120 coupled to data input line 115, write address line 116, read address line 137, clock 169, first stage data output line 151, second stage data output line 152, and third stage data output line 153 as discussed above. In the embodiment shown in FIG. 2, memory array 120 includes a first bank of memory locations 201, a second bank of memory locations 202, and a main array control block 205. In an embodiment, main array control block 205 may determine which locations in the memory array are written to or read from by determining which files are masked. In other embodiments, memory array 120 may contain more or less banks of memory locations. First bank 201 and second bank 202 may be a Register File or Small Signal Array implemented in SRAM or a DRAM topology. In the embodiment shown, first bank 201 has three subdivisions of memory locations 211–213 and second bank 201 has three subdivisions of memory locations 221–223. In other embodiments, first bank 201 and second bank 202 may each have different numbers of subdivisions and may each have more or less subdivisions. Each subdivision may contain a plurality of memory cells, and the size of each subdivision may be the same or different. In an embodiment, main array control block 205 has a plurality of sides, and first bank 201 is located on a different side of main array control block 205 than second bank 202.

As shown in FIG. 2, subdivision 211 of first bank 201 and subdivision 221 of second bank 202 are both coupled to third stage data output line 153. Similarly, subdivision 212 of first bank 201 and subdivision 222 of second bank 202 are both coupled to second stage data output line 152, and subdivision 213 of first bank 201 and subdivision 223 of second bank 203 are both coupled to first stage data output line 151. In an embodiment, main control block 205 may stage the data output from an addressable memory location.

Figure 3:
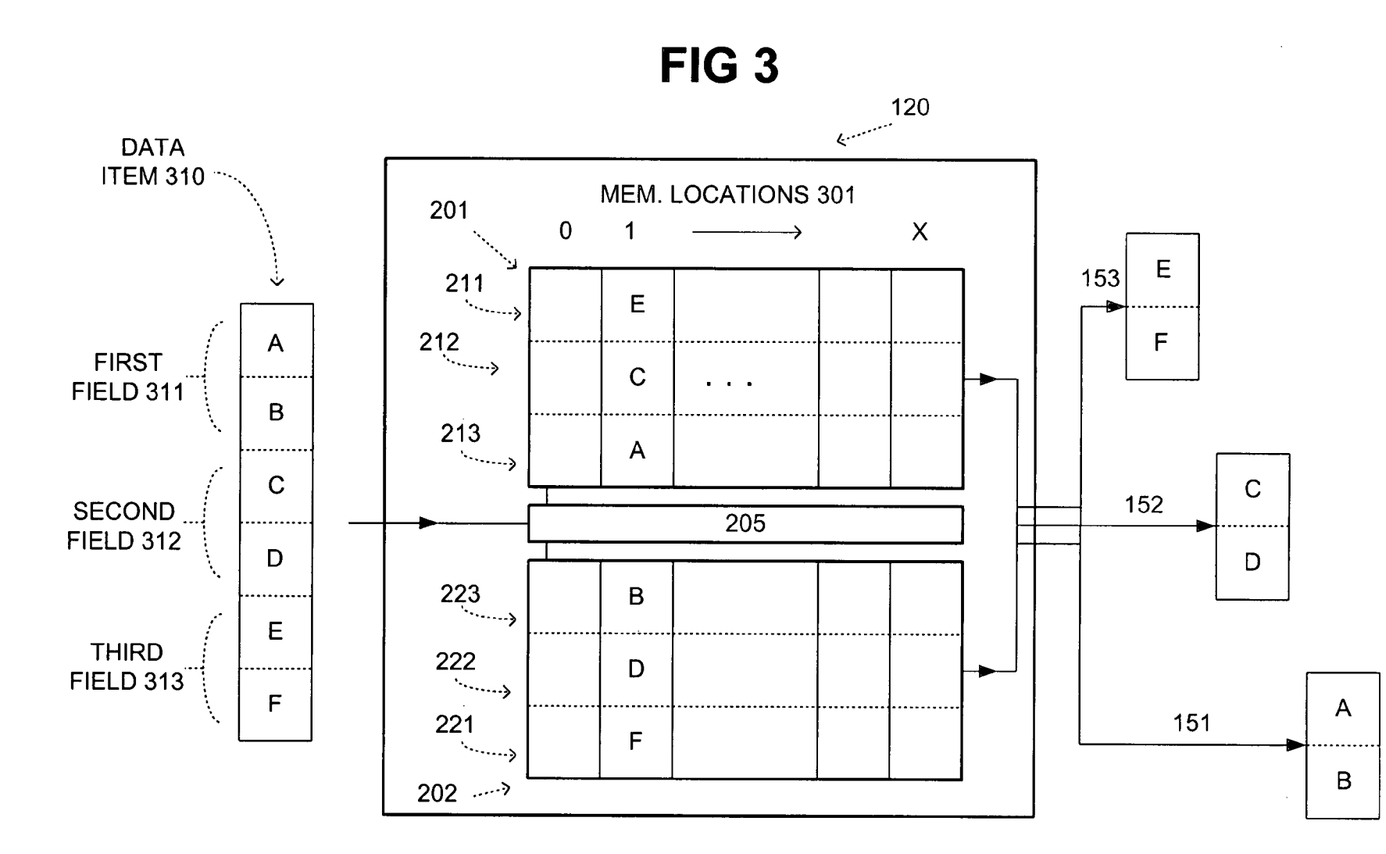
FIG. 3 is a block diagram of a data item being stored in and read out of a memory array in accordance with an embodiment of the present invention.

FIG. 3 is a block diagram of a data item 310 being stored in and read out of memory array 120 in accordance with an embodiment of the present invention. FIG. 3 shows memory array 120 including first bank 201, second bank 202, main array control block 205, and data output lines 151–153 as discussed above. As also discussed above, in FIG. 3 first bank 201 contains subdivisions 211–213 and second bank 202 contains subdivisions 221–223. In FIG. 3, memory array 120 is shown divided into a plurality of addressable memory locations 301 each of which is identified by an address (0 to X). In an embodiment, memory array 120 may store 1024 (1K) memory locations, but of course other embodiments may contain more or less memory locations. As shown in FIG. 3, first bank 201 and second bank 202 each contain a portion of each memory location in memory array 120, subdivisions 211–213 each contain a portion of each memory location in first bank 201, and subdivisions 221–223 each contain a portion of each memory location in second bank 202. In other embodiments, the memory locations may be divided differently.

FIG. 3 also shows a data item 310 which may be an item of data to be stored in memory array 120. As shown in FIG. 3, data item 310 contains three fields 311–313 each of which contain two parts. Data item 310 may contain, for example, three bytes of data, with each byte containing two four-bit parts. In this example, each part may be capable of representing one hexadecimal character. As shown in FIG. 3, first field 311 contains the character "A" in its first part and "B" in its second part, second field 312 contains the character "C" in its first part and "D" in its second part, and third field 313 contains the character "E" in its first part and "F" in its second part. Thus, in this example, data item 310 contains the data "ABCDEF". In other embodiments, data item 310 may contain more or less fields, and each field may contain more or less parts.

FIG. 3 illustrates data item 310 being stored in and read from memory array 120 during different time periods. First, a request is sent to write data item 310 to an address in memory array 120. For example, data item generation circuit 110 of FIG. 1 may send to memory array 120 data ABCDEF over data input line 115 and address "1" over write address line 116 and may send a write enable signal. Memory array 120 may then store the data ABCDEF at memory location 1. In the embodiment shown in FIG. 3, the data E is stored in the subdivision 211 (in first bank 201) for memory location 1, the data F is stored in the subdivision 221 (in second bank 202) for memory location 1, the data C is stored in the subdivision 212 (in first bank 201) for memory location 1, the data D is stored in the subdivision 222 (in second bank 202) for memory location 1, the data A is stored in the subdivision 213 (in first bank 201) for memory location 1, and the data B is stored in the subdivision 223 (in second bank 202) for memory location 1. In order to store the data in this arrangement, parts of data input line 115 may be coupled to subdivisions in memory array 120 in an analogous fashion to the outputs shown in FIG. 2. A request to read the data stored at memory address 1 may then be sent to memory array 120. For example, read request circuit 130 of FIG. 1 may send a read address "1" to memory array 120 over read address line 137 and may send a read enable signal. During a first stage (e.g., a first clock cycle), the data "AB" for first field 311 may be output over first stage output line 151. During a second stage the data "CD" for second field 312 may be output over second stage output line 152, and during a third stage the data "EF" for third field 313 may be output over third stage output line 153. As was shown in FIG. 3, each stage output line may be coupled to different subdivisions in the memory array. In an embodiment, two or more stages may be output from the memory array over a single output line.

According to embodiments such as discussed above, a memory array containing a plurality of addressable memory locations may be adapted to stage the output for a particular addressable memory location. In embodiments, main array control block 205 of FIG. 2 may comprise a circuit that stages the outputs from memory array 120 by, for example, variably delaying the control signals to each subdivision of that memory location. In an embodiment, each of the stages is output during a different clock cycle.

Figure 4:
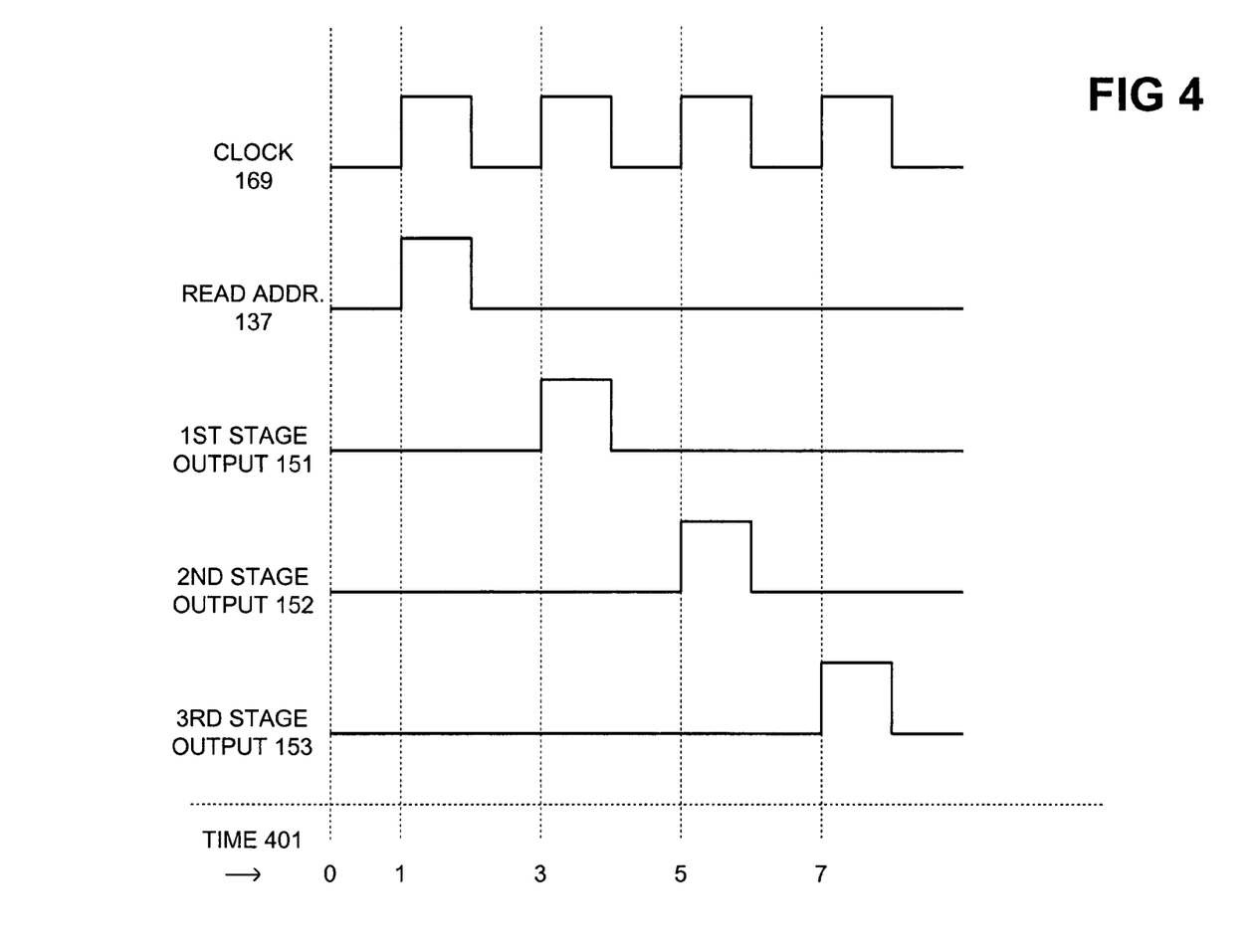
FIG. 4 is a timing diagram for the reading of a data item from a memory array in accordance with an embodiment of the present invention.

FIG. 4 is a timing diagram for the reading of a data item from a memory array in accordance with an embodiment of the present invention. FIG. 4 has time 401 along the x-axis. The times 0, 1, 3, 5, and 7 are shown for illustration purposes. On the y-axis, FIG. 4 has clock 169, read address input 137, first stage output 151, second stage output 152, and third stage output 153. In this example, a read address (and enable signal) is input to memory array 120 at time 1 at the beginning of a first clock cycle. For example, the address "1" may be input over read address line 137. In response to this read request, memory array 120 may output the data stored at address 1 in three stages. For example, the data AB stored in the subdivisions that contain the first field of the data stored in location 1 may be output over first stage output line 151 at time 3 (at the beginning of a second clock cycle). The data CD stored in the subdivisions that contain the second field of the data stored in location 1 may be output over second stage output line 152 at time 5 (at the beginning of a third clock cycle). The data EF stored in the subdivisions that contain the third field of the data stored in location 1 may be output over third stage output line 152 at time 7 (at the beginning of a fourth clock cycle). Of course, the timing shown in FIG. 4 is just an example and other timings may be possible.

Figure 5:
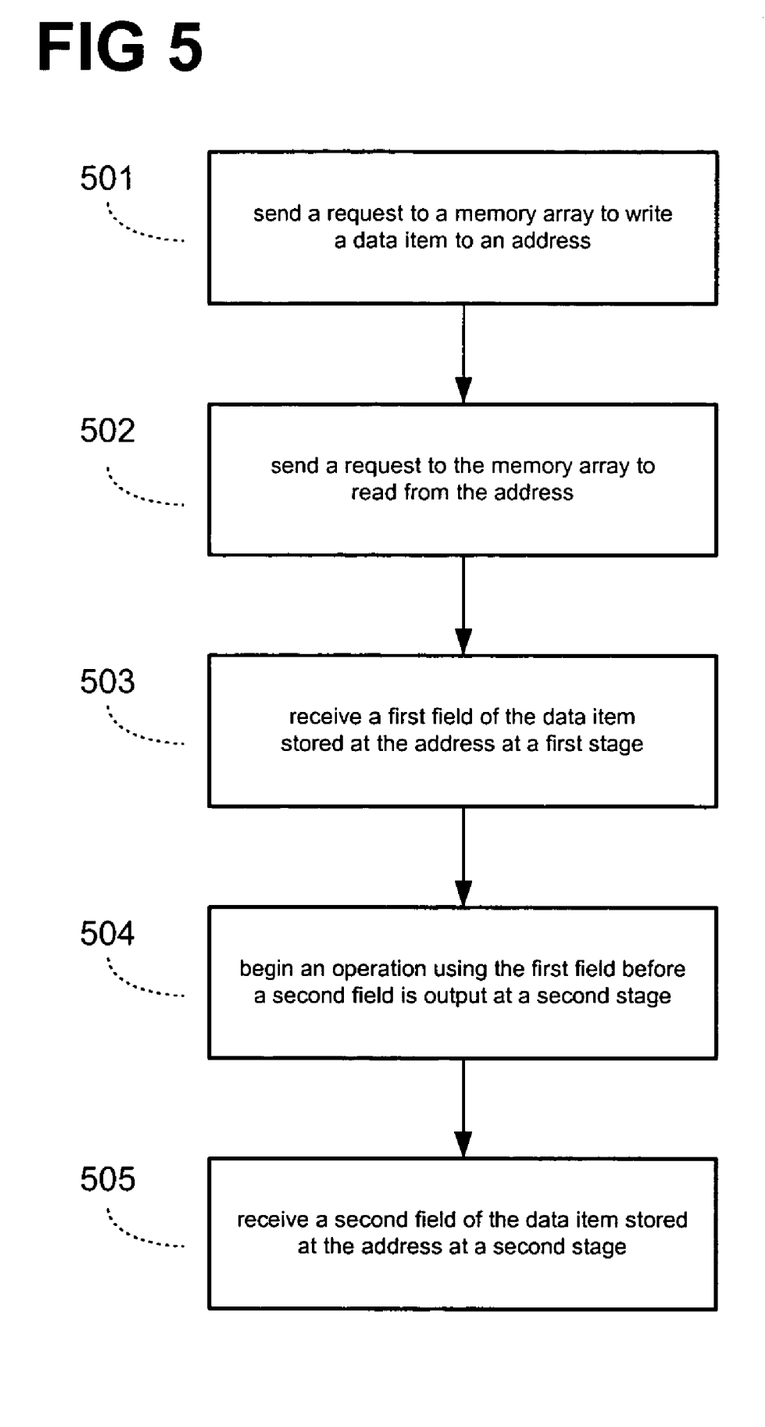
FIG. 5 is a flow diagram for a method of writing a data item to and reading a data item from a memory array in accordance with an embodiment of the present invention.

FIG. 5 is a flow diagram for a method of writing a data item to and reading a data item from a memory array in accordance with an embodiment of the present invention. The method shown in FIG. 5 may be practiced, for example, with the embodiments shown in FIGS. 1–4. As shown in FIG. 5, a request may be sent, for example by data item generation circuit 110, to a memory array such as memory array 120 to write a data item such as data item 310 to a particular address in memory array 120 (501). For example, the data ABCDEF may be written to memory location 1 in memory array 120. A request may then be sent, for example by read request circuit 130, to read from that address in memory array 120 (502). A data consumer such as consumer 141 may then receive a first stage of the data item stored at the particular location (503) at a first time, and data consumer 141 may begin an operation using the first field of the data before a second stage is output (504). For example, consumer 141 may receive the first field 311 during a first clock cycle and may begin an operation using that field during the same clock cycle. A second field 312 of the data stored at that particular address may then be output at a later clock cycle and received by a data consumer, such as data consumer 142 (505).

In an embodiment, the first stage that is output from the memory array is more time critical to system operation than the second stage. For example, system operation may be slowed down if data consumer 141 does not begin operating on the first stage data before data consumer 142 begins operating on the second stage of the data. This time criticality may be due, for example, to the speed at which data consumer 141 completes its operations on the data or to the system's more pressing need for the output from data consumer 141. In other embodiments, later output stages are less time critical than earlier stages.

Figure 6:
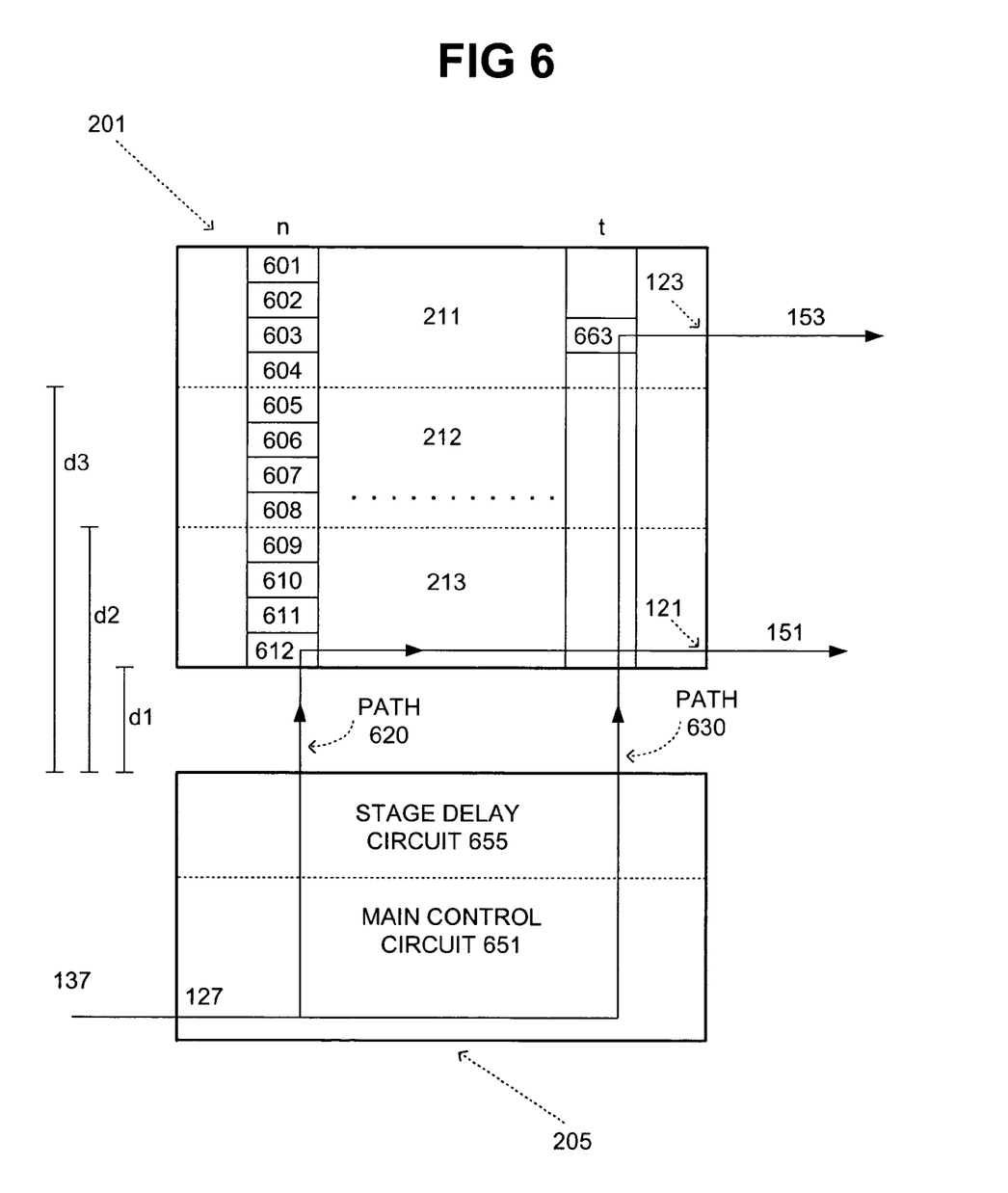
FIG. 6 is a more detailed block diagram of a memory bank and associated main array control block for a memory array in accordance with an embodiment of the present invention.

FIG. 6 is a more detailed block diagram of first memory bank 201 and associated main array control block 205 for memory array 120 in accordance with an embodiment of the present invention. As shown in FIG. 6, main array control block 205 contains a main control circuit 651, which may be any type of main array control circuitry as is known in the art, and stage delay circuit 655. Stage delay circuit 655 may be any sequential element that causes a delay and may be, for example, a row of laches such as used in a phased based system or a row of flip-flops such as used in a cycle based system. In other embodiments, the stage delay circuit 655 may be located outside of the main array control block. For example, each subdivision in the first bank 201 may contain the corresponding stage delay circuit. As show in FIG. 3, first memory bank 201 comprises a plurality of memory cells which each store one or more bits of data. In the embodiment shown, cells 601–604 store the data for a first subdivision of a memory location n, cells 605–608 store the data for a second subdivision of that memory location, and cells 609–612 store the data for a third subdivision of that memory location. Cell 663 stores the data for a first subdivision of a different memory location t.

FIG. 6 shows read address line 137 coupled to input port 127 in main control circuit 651 in main array control block 205. Input port 127 is coupled to a control/data path 620 and a control/data path 630. Path 620 proceeds from main control circuit 651, through stage delay circuit 655, through cell 612, to output port 121, and to third stage output line 151. Path 630 proceeds from main control circuit 651, through stage delay circuit 655, through cell 633, to output port 123, and to first stage output line 153. Path 620 and path 630 may be adapted to transmit control signals to a cell in the memory array (i.e., cell 612 and cell 663) and the output of the data stored in that cell to the corresponding data output line. In an embodiment, memory array 120 contains a plurality of paths that each traverse from the address input port to a different memory cell and from that memory cell to a data output port, and each of these paths traverses the line between the side of the memory array having the input port and the side of the memory line having the output port only once. For example, path 620 traverses from input port 127 to output port 121 without crossing the same horizontal space twice.

FIG. 6 also shows a distance d1 between third subdivision 213 and main array control block 205, a distance d2 between second subdivision 212 and main array control block 205, and a distance d3 between first subdivision 211 and main array control block 205. As can be seen in FIG. 3, third subdivision 213 is closer to main control block 205 than second subdivision 212, and second subdivision 212 is closer to main control block 205 than first subdivision 211. In an embodiment, memory array 120 may output data stored in a first field that is identified by that address before data stored in a second field that is identified by that address if the first field is located closer to the main array control block than the second field. For example, the data stored in the third field 213 for a particular location will be output at a first stage, the data stored in the second field 212 for that particular location will be output at a second stage, and the data stored in the first field 211 for that particular location will be output at a third stage. In this embodiment, the more time critical the data, the closer it will be stored to the main control block 205.

According to embodiments as discussed above, the data in a particular addressable location in memory array may be output in different stages. This may allow for pipelined array planning, and more time critical data may be stored in the array so that it is output before less time critical data. Storing of data in a single array, rather than a set of arrays, alleviates the need for duplicate control circuitry. It will be appreciated that modifications and variations of the embodiments discussed above are covered by the teachings provided and are within the purview of the appended claims.

What is claimed is:

1. A memory array comprising:
   a plurality of addressable memory locations; and
   a circuit to stage the data output from an addressable memory location so that different stages of the data from that addressable memory location are to be output at different times, wherein each stage is a field of the data stored at the memory location.

2. The memory array of claim 1, wherein the different stages are each output during a different clock cycle.

3. The memory array of claim 1, wherein the circuit further comprises a main array control block, and wherein the memory array is to output a first field that is stored at an address at an earlier stage than a second field that is stored at that address if the first field is stored closer to the main array control block than the second field.

4. The memory array of claim 1, wherein the circuit further comprises a main array control block, wherein a plurality of fields having different levels of time criticality are stored at an individual address, and wherein a more time critical field is stored closer to the main array control block than a less time critical field.

5. The memory array of claim 1, wherein the memory array has a plurality of sides, wherein the memory array has an address input port and a plurality of data output ports, and wherein the address input port is on a different side of the memory array than the data output ports.

6. The memory array of claim 1, wherein each addressable memory location comprises a plurality of memory cells, and wherein the memory array further comprises:
   an address input port on a first side of the memory array;
   a plurality of data output ports on a second side of the memory array; and
   a plurality of paths that traverse from the address input port to a one of the memory cells and from that memory cell to a data output port, wherein each path traverses a line between the first side and the second side only once.

7. A memory array comprising:
   a first bank comprising a plurality of memory cells;

an input port to receive an address that identifies a memory location, wherein each memory location comprises a plurality of subdivisions, wherein each subdivision comprises a plurality of said first bank memory cells; and a stage delay circuit to cause each of the memory location subdivisions in the first bank that are identified by a particular address to output data during a different cycle of a clock than any other memory location subdivisions in the first bank that are identified by that address.

8. The memory array of claim 7, wherein the memory array further comprises a main array control block.

9. The memory array of claim 8, wherein memory location subdivisions in the first bank that are identified by a particular address are located at a different distances from the main array control block, and wherein the memory array is to output data stored in a first subdivision that is identified by that address before data stored in a second subdivision that is identified by that address if the first subdivision is located closer to the main array control block than the second subdivision.

10. The memory array of claim 8, wherein the memory array further comprises a second bank coupled to the main array control block, the second bank comprising a plurality of cells, wherein each of the subdivisions in the plurality of memory locations further comprises a plurality of said second bank memory cells, wherein the stage delay circuit is to cause each of the memory location subdivisions in the second bank that are identified by a particular address to output data during a different clock cycle than any other memory location subdivisions in the second bank that are identified by that address.

11. The memory array of claim 10, wherein the main array control block has a plurality of sides, and wherein the first bank is located on a different side of the main array control block than the second bank.

12. The memory array of claim 11, wherein a subdivision of a memory location in the first bank corresponds to a subdivision of that memory location in the second bank, and wherein the memory array outputs data from the corresponding subdivisions in the first bank and second bank during the same clock cycle.

13. The memory array of claim 7, wherein the memory array further comprises a plurality of data output ports, wherein the memory array has a plurality of sides, and wherein the input port and the plurality of data output ports are on opposite sides of the memory array.

14. A memory array comprising:
a main array control block to control the output of data items from the memory array for a plurality of addresses, wherein the main array control block has a plurality of sides;
a first bank of memory cells located on a first side of the main array control block, wherein the first bank is to store a first field of each of said data items; and
a second bank of memory cells located on a different side of the main array control block than the first bank, wherein the second bank is to store a second field of each of said data items.

15. The memory array of claim 14, wherein the memory array is to output the data for an individual address in different stages.

16. The memory array of claim 15, wherein data for a first stage for an individual memory address is output from both the first bank and the second bank.

17. The memory array of claim 14, wherein each data item comprises a plurality of fields, and wherein the memory array is to output a first field for a data item at an earlier stage than a second field for that data item if the first field is located closer to the main array control block than the second field.

18. The memory array of claim 14, wherein the memory array has a plurality of sides, wherein the memory array has an address input port and a plurality of data output ports, and wherein the address input port is on a different side of the memory array than the data output ports.

19. The memory array of claim 14, wherein for each individual address the memory array is to store a plurality of data fields having different levels of time criticality, and wherein a more time critical field is stored closer to the main array control block than a less time critical field.

20. A method comprising:
sending a request to a memory array to read from an address; and
receiving the data item stored at the address from the memory array, wherein the data item is output as a plurality of data fields, wherein the fields are output in stages, and wherein a most time critical field in the data item is output before a less time critical field in the data item.

21. The method of claim 20, wherein the method further comprises:
receiving a first field that is output at a first stage; and
beginning an operation using the first field before a second field is output at a second stage.

22. The method of claim 21, wherein the memory array is a trace cache.

23. The method of claim 21, wherein the memory array includes a main array control block, wherein the first field is stored in the memory array in a first subdivision of cells and the second field is stored in the memory array in second subdivision of cells, and wherein the main array control block is closer to the first subdivision of cells than the second subdivision of cells.

* * * * *